United States Patent [19]
Yamaguti

[11] Patent Number: 4,709,301
[45] Date of Patent: Nov. 24, 1987

[54] PACKAGE

[75] Inventor: Yukio Yamaguti, Tokyo, Japan

[73] Assignee: NEC Corporation, Tokyo, Japan

[21] Appl. No.: 900,532

[22] Filed: Aug. 26, 1986

[30] Foreign Application Priority Data

Sep. 5, 1985 [JP] Japan .................................. 60-197007
Dec. 6, 1985 [JP] Japan .................................. 60-273368
Dec. 6, 1985 [JP] Japan .................................. 60-273369

[51] Int. Cl.$^4$ .......................... H02B 1/00; H05K 7/20
[52] U.S. Cl. ...................................... 361/387; 361/417
[58] Field of Search ............... 361/386, 418, 417, 387, 361/395

[56] References Cited

U.S. PATENT DOCUMENTS

| | | | |
|---|---|---|---|
| 3,164,749 | 1/1965 | Berge et al. | 361/417 |
| 3,361,937 | 1/1968 | Winkler et al. | 361/418 |
| 3,626,252 | 12/1971 | Cath | 361/387 |
| 4,326,238 | 4/1982 | Takeda et al. | 361/386 |

OTHER PUBLICATIONS

"Non-Hermetic Packaging Techniques for Hybrids'—Jun. 1979—Older et al.

Primary Examiner—Roy N. Envall, Jr.
Attorney, Agent, or Firm—Burns, Doane, Swecker & Mathis

[57] ABSTRACT

A method for forming a package, and corresponding package structure are disclosed. An electronic component is mounted on a substrate via a spacer, and the component is electrically connected to wiring embedded in the substrate. A space is defined in between the component, the spacer, and the substrate by the electrical connecting path. A first silicone material is filled within said defined space, and a second relatively more hardened silicone material is disposed in an area outside of said defined space and covering the electrical connecting path and portions of the upper surface of the substrate. More particularly, some first silicone material may also be disposed outside the defined space, and covered by the second silicone material. The second silicone material is at first in liquid form and of less viscosity than the first silicone material when originally disposed, and is subsequently hardened by either heating or irradiation.

32 Claims, 3 Drawing Figures 4,709,301

PACKAGE

BACKGROUND OF THE INVENTION

The present invention relates to a package with electronic components mounted in a manner that is easily removal without damage.

In a conventional package, integrated circuit (IC) chips are mounted on a substrate on and in which wirings are formed to be electrically connected to circuits contained in the chips by leads. Further, the leads and the upper surface of the substrate are coated with silicone resin. This resin coating is intended to protect said wirings formed on the substrate and said leads from moisture. An example of such a conventional package is disclosed in a paper entitled "Non-hermetic packaging techniques for hybrids" by Brad Older and Richard A. Bly, published in June 1979 in the Electronic Packaging and Production, pp. 137 to 139.

In the disclosed prior art package, it is difficult, when replacing the chips, to remove the silicone resin existing in each space surrounded by the leads, the lower surface of each chip and the upper surface of the substrate. Moreover, when the package is soaked in organic solvent to remove the silicone resin, the resin expands such that the leads may come off the substrate or be cut.

SUMMARY OF THE INVENTION

One object of the invention is, therefore, to provide a package free from the above-mentioned disadvantages in the conventional package.

According to an aspect of the invention, there is provided a package which comprises: a substrate; a plurality of pads formed on the upper surface of said substrate; at least one electronic component having a plurality of leads to be connected to said pads and mounted on the upper surface of said substrate; a fluid silicone material filled in a space surrounded by said leads, the lower surface of said electronic component and the upper surface of said substrate; and a hardened silicone material for covering the upper surface of said substrate and the fluid silicone material.

BRIEF DESCRIPTION OF THE DRAWINGS

Other features and advantages of the invention will become more apparent from the following detailed description when taken in conjunction with the accompanying drawings in which:

FIG. 1 and FIG. 2 show a cross-sectional view and a plan view of a first embodiment, respectively.

In the drawings, the same reference numerals represent the same structural elements.

DETAILED DESCRIPTION OF THE PREFERRED EMBODIMENTS

Figure 1:
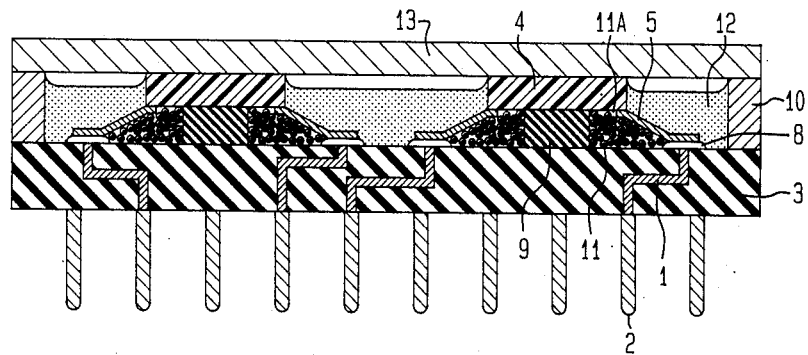

Referring to FIG. 1, a first embodiment of the invention comprises a substrate 3 including a plurality of conductive wirings 1; a plurality of input/output pins 2 are provided on the lower surface of the substrate 3; a plurality of pads 8 are provided on the upper surface of the substrate 3; a frame 10 made of iron-nickel-cobalt alloy or the like is fitted onto the circumference of the upper surface of the substrate 3 by an adhesive (for instance, an epoxy adhesive); a cap 13 made of aluminum nitride or the like by fitted to the frame 10 by an adhesive as to be opposite to the upper surface of the substrate 3; a plurality of spacers 9 made of silicone rubber or the like are fixed to the upper surface of the substrate 3 by an adhesive; a plurality of integrated circuit (IC) chips 4 are fixed to the spacers 9 with an adhesive; a first silicone-filled portion 11 and a second silicone-filled portion 12 are formed by a method which will be described later on. Onto the upper surface of the cap 13 may be fitted one or more heat sinks for air-cooling or water-cooling. Between the lower surface of the cap 13 and the upper surfaces of the chips 14 may be inserted a compound having a good heat-conductivity. Heat generated from the chips 4 is transmitted either directly or through the compound to the cap 13, and further dispersed outside through the heat sink. If the frame 10 is formed of an electrically insulating material, an electroconductive adhesive can be used.

Around the lower surface of each of the chips 4 are fitted the one end of a plurality of leads 5 at minute intervals. The other ends of the leads 5, radially extending from the chips 4, are connected to the pads 8 by bonding or the like. As a result, the pins 2 and circuits contained within the chips 4 are electrically connected through the wirings 1, the pads 8 and the leads 5.

The following is a discussion of how the silicone-filled portions 11 and 12 are formed.

First, after mounting of the chips 4 onto substrate 3, a first fluid silicone material having a high viscosity is filled into spaces 11a below the chips 4, by using an injector or the like. Each space 11a is surrounded by the lower surface of a corresponding one of the chips 4, corresponding ones of the leads 5, the four sides of a corresponding one of spacers 9 and the upper surface of the substrate 3. As a result, the first silicone-filled portions 11 are formed. For this silicone material, silicone impregnant available from Shinetsu Silicone Company under the trade name KJF-812 may be used among many others. Next, a second fluid silicone material is poured over the substrate 3 to form the second silicone-filled portion 12. For the second silicone material, heat-hardened type potting agent available from Toray Silicone Company, Ltd. under the trade name SH1851 may be used, among many others. Since the first silicone material has a higher viscousness than the second silicone material, the former remains within the spaces 11a and does not to mix with the latter. After that, the entire package is kept for an hour or two in an air atmosphere at about 125° C. (degrees centigrade) to harden and to transform the second silicone material into a gel state. At this time, the first silicone material has not become hard. The portions 11 and 12 thus formed protect wirings and the like formed on the upper surface of the substrate 3 from moisture and other undesirable factors.

Though the first silicone material used in the embodiment has a high viscosity, other fluid silicone materials having a lower viscosity may be used as well. In that case, the substrate 3 is turned upside down after pouring such a fluid silicone material over the substrate 3. As a result, though the most part of the poured fluid silicone material is discarded, the fluid silicone material within the spaces 11a remains as it stands due to its surface tension. After that, the second silicone material is poured and it alone is hardened by heating.

Further, an ultraviolet (UV) hardened type silicone material can be used for both the portions 11 and 12. In this case, the UV-hardened type silicon material is poured over the substrate 3. An UV ray is then irradiated from above, so that the part of the poured silicone material hidden by the chips 4 and the leads 5 when the substrate 3 is viewed from above, is unhardened or only half-hardened to constitute the portions 11 while the remaining part is hardened into a gel state to form the portion 12. As such an UV-hardened type silicone material, the one available from Toshiba Silicone Company under the trade name TUV6000 may be used.

Figure 3:
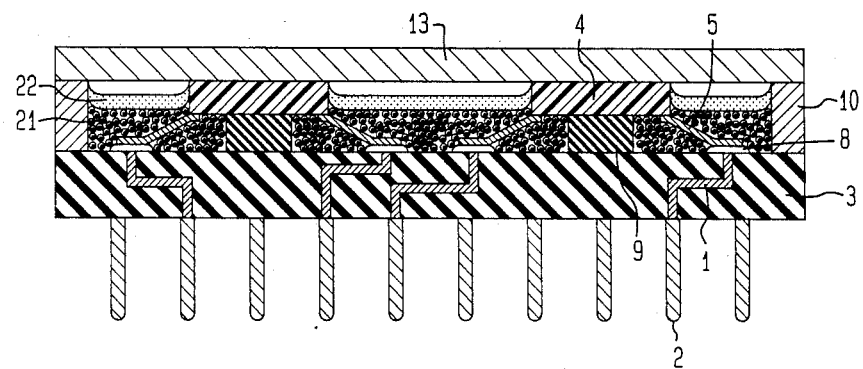
FIG. 3 shows a cross-sectional view of a second embodiment.

Referring now to a second embodiment shown in FIG. 3, like the first embodiment, the chips 4 and the frame 10 are first mounted over the substrate 3. Next, a first silicone material is poured to form a first silicone-filled portion 21, followed by the pouring of a second silicone material for the forming of a second silicone-filled portion 22. For these first and second silicone materials, the above-mentioned KJF-812 and SH1851 may be employed, respectively. Like in the case of the first embodiment, the entire package is then kept for an hour or two in an air atmosphere at about 125° C. to harden the fourth silicone material alone into a gel state. Finally, the cap 13 is fitted to the frame 10 to complete the package.

Though the heat-hardened type silicone material is described above for the second silicone material in this embodiment, an UV-hardened type one, like the TUV6000 mentioned above, may be used as well. In the case of TUV6000 and the like; naturally, the second silicone material is hardened by UV irradiation.

When the first and second silicone materials of the packages described above to are to be removed from the portions 11 and 12, or 21 and 22 for replacing the chips or for any other purpose such as changing of the design or repairing of the package, the first silicone material can be readily washed away from the portion 11 or 21 with organic solvent after the second silicone material is removed from the portion 12 or 22. Therefore, in both the first and second embodiment, the leads 5 will not or come off the pads 8 or be cut in process of the silicone removal.

While the present invention has been described in conjunction with the preferred embodiments thereof, it will now readily be possible for those skilled in the art to put this invention into practice in various other manners within the scope of the invention defined by the appended claims.

What is claimed is:

1. A package comprising:
   a substrate;
   a plurality of pads formed on the upper surface of said substrate;
   at least one electronic component having a plurality of leads to be connected to said pads and mounted on the upper surface of said substrate;
   a fluid silicone material filled in a space surrounded by said leads, the lower surface of said electronic component and the upper surface of said substrate; and
   a hardened silicone material which covers the upper surface of said substrate and the fluid silicone material and exhibits a lower viscosity than said fluid silicone material before the hardened silicone material is hardened.

2. A package as claimed in claim 1, further comprising a frame-like member provided on the circumference of the upper surface of said substrate and a cap so fitted to said frame-like member as to cover said substrate.

3. A package as claimed in claim 1, wherein said hardened silicone material is a heat-hardened type silicon material.

4. A package comprising:
   a substrate having an upper surface;
   a plurality of pads formed on said upper surface of said substrate;
   at least one electronic component having a lower surface and including a plurality of leads to be connected to said pads and mounted on said upper surface of said substrate;
   a fluid silicone material filled in a space surrounded by said leads, said lower surface of said electronic component and said upper surface of said substrate; and
   an ultraviolet-hardened type silicone material for covering said upper surface of said substrate and said fluid silicone material.

5. A package as claimed in claim 4, wherein said fluid silicone material is an ultraviolet-hardened type silicone material.

6. A package comprising:
   a substrate;
   a plurality of pads formed on the upper surface of said substrate;
   at least one electronic component having a plurality of leads to be connected to said pads and mounted on the upper surface of said substrate;
   a fluid silicone material filled in a space surrounded by the upper surface of said substrate and the inner surfaces of said frame-like member at least to such an extent that said leads are immersed in said fluid silicone material; and
   a hardened silicone material for covering said fluid silicone material.

7. A package as claimed in claim 6, wherein said hardened silicone material is a heat-hardened type silicone material.

8. A package as claimed in claim 6, wherein said hardened silicone material is an ultraviolet-hardened type silicone material.

9. A package comprising:
   a substrate including embedded wiring,
   means for connecting an electronic component mounted on said substrate to said wiring, said connecting means being so disposed that it defines a space between said electronic component and an upper surface of said substrate;
   first silicone material filling said defined space; and
   second silicone material hardened in relation to said first silicone material, outside of said defined space and covering said connecting means, said second silicone material exhibiting a lower viscosity than said first silicone material before said second silicone material is hardened.

10. A package as recited in claim 9, wherein said first silicone material is excluded from any area external to said defined space and said second silicone material is excluded from any area internal to said defined space.

11. A package as recited in claim 10, further comprising:
    a peripheral frame also mounted on said substrate, encircling said electronic component, said connecting means and said first and second silicone material.

12. A package as recited in claim 10 wherein said electronic component is mounted to said upper surface of said substrate via a spacer element connected to a bottom surface of said electronic component, said spacer element also partially defining said space.

13. A package as recited in claim 11 wherein said electronic component is mounted to said upper surface of said substrate via a spacer element connected to a bottom surface of said electronic component, said spacer element also partially defining said space.

14. A package as recited in claim 11 further comprising a cap covering said frame and enclosing said electronic component, said connecting means and said first and second silicone material in between said cap, said substrate, and said frame.

15. A package as recited in claim 14 wherein portions of the bottom surface of said cap are immediately juxtaposed in parallel to the upper surface of said frame and of said electronic component, respectively.

16. A package as recited in claim 13, wherein said connecting means includes leads coupled at one end to said electronic component, and pads coupled at one end to a second end of said leads and at another end to said wiring.

17. A package as recited in claim 15, wherein said connecting means includes leads coupled at one end to said electronic component, and pads coupled at one end to a second end of said leads and at another end to said wiring.

18. A package as recited in claim 9, wherein said second silicone material covers said connecting means indirectly via additional first silicone material disposed outside of said defined space.

19. A package as recited in claim 12, wherein said second silicone material covers said connecting means indirectly via additional first silicone material disposed outside of said defined space.

20. A package as recited in claim 14, wherein said second silicone material covers said connecting means indirectly via additional first silicone material disposed outside of said defined space.

21. A package as recited in claim 17, wherein said second silicone material covers said connecting meand indirectly via additional first silicone material disposed outside of said defined space.

22. A method for forming a package including an electronic component mounted to a substrate having embedded wiring comprising the steps of:
  electrically connecting said electronic component to said embedded wiring thus forming a defined space in between said connecting path, said electronic component and said substrate;
  filling said defined space with a first fluid silicone material;
  pouring into an area outside of said defined space a second silicone material of lower viscosity than that of said first silicone material;
  hardening said second silicone material in relation to said first silicone material.

23. A method as recited in claim 22, wherein said filling step includes the step of excluding said first silicone material from outside of said defined space.

24. A method as recited in claim 22, wherein said filling step further includes the step of admitting said first fluid silicone material to an area outside of said defined space and over said substrate so as to immerse said connecting path in said first fluid silicone material, and
  said pouring step further includes the step of covering said first fluid silicone material outside of said defined space by said second fluid silicone material.

25. A method as recited in claim 23, wherein said excluding step includes the step of injecting said first fluid silicone material into said defined space without overflowing into an area external to said defined space.

26. A method as recited in claim 23, wherein said excluding step includes the step of turning said package up side down to remove all said first fluid silicone material outside of said defined space, said first fluid silicone material within said defined space remaining due to surface tension.

27. A method as recited in claim 24, wherein said electronic component is mounted to said substrate by a spacer element also partially defining said space.

28. A method as recited in claim 25, wherein said electronic component is mounted to said substrate by a spacer element also partially defining said space.

29. A method as recited in claim 26, wherein said electronic component is mounted to said substrate by a spacer element also partially defining said space.

30. A method as recited in claim 22 wherein said hardening is effected via one of heating and radiation exposure steps.

31. A method as recited in claim 22 wherein said hardening is effected via one of heating and radiation exposure steps.

32. A method as recited in claim 24 wherein said hardening is effected via one of heating and radiation exposure steps.

* * * * *